(12) United States Patent
Kim

(10) Patent No.: US 6,498,105 B1
(45) Date of Patent: Dec. 24, 2002

(54) METHOD OF FORMING FINE PATTERNS OF A SEMICONDUCTOR DEVICE

(75) Inventor: Ki-Joan Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 58 days.

(21) Appl. No.: 09/583,551

(22) Filed: Jun. 1, 2000

(30) Foreign Application Priority Data

Jun. 1, 1999 (KR) .............................................. 99-19985

(51) Int. Cl.[7] .............................................. H01L 21/311
(52) U.S. Cl. ....................... 438/700; 438/702; 438/703; 438/717; 438/724; 438/725; 438/754; 438/757
(58) Field of Search ................................ 438/700, 702, 438/703, 717, 724, 725, 754, 757; 252/79.1; 257/510

(56) References Cited

U.S. PATENT DOCUMENTS

| | | | |
|---|---|---|---|
| 5,573,634 A | * 11/1996 | Ham | 430/312 |
| 5,882,827 A | * 3/1999 | Nakau | 430/5 |
| 6,162,370 A | * 12/2000 | Hackett et al. | 252/79.1 |
| 6,204,187 B1 | * 3/2001 | Rupp et al. | 430/702 |
| 6,281,562 B1 | * 8/2001 | Sagawa | 257/510 |
| 6,303,514 B1 | * 10/2001 | Hackett et al. | 252/79.1 |

FOREIGN PATENT DOCUMENTS

| | | | | |
|---|---|---|---|---|
| JP | 5243115 | 9/1993 | | |
| JP | 0907105 A2 | * 4/1999 | | G03F/1/00 |

OTHER PUBLICATIONS

S. Wolf, Silicon Processing for the VLSI Era. vol. 1—Process Technology, p. 534.*
S. Wolf, Silicon Processing For The VLSI Era, 1986, Lattice Press, vol. 1, pp. 193–195.*

* cited by examiner

Primary Examiner—Matthew Smith
Assistant Examiner—Belur Keshavan
(74) Attorney, Agent, or Firm—Lee & Sterba, P.C.

(57) ABSTRACT

A method of forming fine patterns of semiconductor devices comprises patterning one material layer using at least two sub-photomasks. The material layer is formed on a semiconductor substrate, and the material layer is patterned at least twice using each of the sub-photomasks. The shapes and sizes of the patterns on one sub-photomask are different to those of the other sub-photomask, and the patterns of one sub-photomask may partially overlap those of the other sub-photomask. The profiles of all patterns formed on the one material layer can thereby be optimized.

6 Claims, 8 Drawing Sheets

METHOD OF FORMING FINE PATTERNS OF A SEMICONDUCTOR DEVICE

BACKGROUND OF THE INVENTION

1. Field of the Invention

The present invention relates to a method of fabricating semiconductor devices and, more particularly, to a method of forming fine patterns of semiconductor devices.

2. Description of the Related Art

There is currently a great amount of research in methods for forming fine patterns of semiconductor devices and photomasks necessary therefore because semiconductor devices are becoming more highly integrated. Presently, a phase shift mask process is widely used to form fine patterns of semiconductor devices because it is highly effective in forming periodic patterns. However, elaborate techniques are required to form a phase shift mask, and it is expensive to fabricate the phase shift mask, moreover, phase shift mask processes do not effectively form aperiodic patterns. Thus, processes using a phase shift mask are inappropriate for forming fine aperiodic or abnormal patterns at low cost. Since, pattern density increases as integration increases and pattern abnormalities increase as pattern density increases, pattern abnormalities in semiconductor devices increase with the increased integration thereof.

FIG. 1 is a plan view partially showing a conventional photomask 1. Here, reference numerals 5 and 7 denote a cell array region having high pattern density and a peripheral circuit region having low pattern density, respectively.

Referring to FIG. 1, adjacent contact hole patterns 3 are two-dimensionally separated by a predetermined distance d in the cell array region 5. On the other hand, contact hole patterns 3 in the peripheral circuit region 7 are two-dimensionally separated by a distance which is wider than the predetermined distance d.

FIG. 2A is a cross-sectional view of the photomask 1 shown in FIG. 1 taken along line A–A'. FIG. 2B is a graph of the light intensity of light beams passing through the contact hole patterns 3 of the photomask 1 shown in FIG. 2A. FIG. 2C is a cross-sectional view of a profile of a photoresist pattern 26 formed in accordance with the light intensity of the graph shown in FIG. 2B. Here, reference characters 5 and 7 denote the cell array region 5 and the peripheral circuit region 7 of FIG. 1, respectively.

Referring to FIGS. 2A, 2B and 2C, an interdielectric layer 23 is formed on a semiconductor substrate 21, and an etch mask layer 25 having a high selectivity with respect to the interdielectric layer 23 is formed on the interdielectric layer 23. A photoresist layer 26 is formed on the etch mask layer 25, and the photoresist layer 26 is exposed to ultraviolet light using the photomask 1 and light 20 shown in FIG. 2A. The photomask 1 is composed of a transparent substrate 22 and an opaque material pattern 24 formed in a predetermined region on one side of the transparent substrate 22. The opaque material pattern is made of a chrome pattern. The opaque material pattern 24 is formed in the regions between the plurality of contact hole patterns 3 shown in FIG. 1. That is, the opaque material pattern 24 is formed by removing material or preventing the formation of material where the contact hole patterns 3 are transcribed thereon, thereby defining holes where the contact hole patterns are transcribed.

As described above, light 20 passes through the transparent substrate 22 and through the contact hole patterns 3 of the opaque material pattern 24 when the light 20 radiates the photomask 1. The light which passes through the transparent substrate 22 and the contact hole patterns 3 exposes a predetermined region of the photoresist layer 26 formed on the semiconductor substrate 21. The diffraction or interference effect on the light beams passing through the transparent substrate 22 and contact hole patterns 3 is more severe as the distance d between adjacent holes in the contact hole pattern 3 decreases. The etch mask layer 25 is formed on the interdielectric layer 23 and acts as an antireflection layer, but the diffraction and interference effects cannot be overcome.

Thus, as shown in FIG. 2B, light beams irradiate some of the region under the opaque material pattern 24. As a result, the portion of the photoresist pattern 26 corresponding to the contact hole patterns 3 formed in the cell array region 5 are inaccurately formed. Thus, when the etch mask layer 25 and the interdielectric layer 23 are etched using the photoresist pattern 26 as a mask, contact holes having an inaccurate profile are formed in the cell array region 5.

In the conventional art, when the sizes or shapes of patterns of the photomask 1 are different, it is difficult to optimize profiles of all patterns formed on the semiconductor substrate. For example, when patterns having various sizes or shapes are mixed in the photomask 1, it is difficult to optimize profiles of all patterns. This is because conditions of the photo process, for example, conditions of exposure and development, must be changed in accordance with the size or the shape of the pattern.

The present invention is directed to overcoming or at least reducing the effects of one or more of the problems set forth above.

SUMMARY OF THE INVENTION

In accordance with one aspect of the present invention there is provided a photomask for forming fine patterns capable of optimizing the profiles of all patterns formed in a high pattern density region. More specifically, there is provided a photomask for forming fine patterns by etching one material layer formed on a semiconductor substrate. The photomask for forming fine patterns includes at least two sub-photomasks. Each of the sub-photomasks is composed of one transparent substrate and patterns on one side of the transparent substrate. All of the patterns to be formed can be thought of as an entire set of patterns which are split into subsets of patterns. The union of the subset of patterns is the entire set of patterns. Each sub-photomask is transcribed with a corresponding subset of patterns. The patterns of one sub-photomask correspond to one of the groups obtained by classifying a group of patterns finally formed on the semiconductor substrate. For instance, when the photomask is composed of two sub-photomasks, patterns on a substrate of the first sub-photomask (i.e., patterns of a first group) are patterns obtained by transcribing some of the entire set of patterns. The patterns on a substrate of the second sub-photomask (i.e., patterns of the second group) are patterns obtained by transcribing the entire set of patterns with the exception of the patterns of the first group.

In accordance with another aspect of the present invention, at least one of the patterns on one sub-photomask may overlap with at least one of the patterns on another sub-photomask. The overlapped pattern may correspond to a pattern such as an alignment key, which is difficult to completely pattern with one photo process.

In a further aspect of the present invention, when the sizes of the patterns in the entire set of patterns are the same, the minimum distance between patterns on the substrate of each of the sub-photomasks is wider than the minimum distance among the entire set of patterns. Thus, when the photo process is performed using each of the sub-photomasks, the distance between patterns is increased, so that the interference and/or diffraction effect of light beams can be remarkably suppressed.

In accordance with yet another aspect of the present invention, when there are two different shapes of patterns in the entire set of patterns, patterns of the same shape are transcribed on a substrate of one sub-photomask. For instance, when the entire set of patterns are classified into two kinds of shapes, i.e., rectangular patterns and regular square patterns, the rectangular patterns are transcribed on the substrate of one sub-photomask and regular square patterns are transcribed on the substrate of another sub-photomask. Here, the rectangular pattern may be a pattern for forming an interconnection of a bar type or a pattern for forming an oval contact hole, and the regular square pattern may correspond to a pattern for forming a circular contact hole. Thus, it is easy to optimize the profiles of the regular square patterns and rectangular patterns formed on the semiconductor substrate by changing the process conditions whenever a photo process using each of sub-photomask is performed.

In accordance with another aspect of the present invention there is provided a method of forming fine patterns using the photomask. More specifically, there is provided a method of forming fine patterns capable of optimizing the profiles of all patterns formed on a semiconductor substrate. In this method, one material layer to be patterned such as a dielectric layer or a conductive layer is formed on the semiconductor substrate, and the material layer is patterned using at least two sub-photomasks. Here, the sub-photomasks are the same as those of the sub-photomask for forming fine patterns. As a result, the method of forming fine patterns requires the same number of photo processes as the number of sub-photomasks.

In a further aspect of the present invention, when two sub-photomasks are used (i.e., first and second sub-photomasks) the step of patterning the material layer includes the sub-steps of forming a first photoresist pattern on the material layer using the first sub-photomask; first-patterning the material layer using the first photoresist pattern as an etch mask; removing the first photoresist pattern; forming a second photoresist pattern using the second sub-photomask which is different from the first sub-photomask on the semiconductor substrate where the first photoresist pattern is removed; patterning the first patterned material layer using the second photoresist pattern as an etch mask, thereby forming a plurality of patterns in the material layer.

In accordance with yet another aspect of the present invention, the present invention may further comprise a sub-step of forming an etch mask layer having an etch selectivity with respect to the material layer. At least two of the sub-photomasks are used for patterning the etch mask layer. Also, the material layer is patterned by one etching process using the patterned etch mask layer as an etch mask, thereby forming desired patterns. The etch mask layer is formed of a silicon nitride layer or a silicon oxynitride layer acting as an antireflection layer. When the two sub-photomasks are first and second sub-photomasks, the step of patterning the material layer includes the sub-steps of: forming the first photoresist pattern on the etch mask layer using the first sub-photomask; patterning the etch mask layer using the first photoresist pattern as an etch mask; removing the first photoresist pattern; forming a second photoresist pattern on the semiconductor substrate where the first photoresist pattern is removed; using the second sub-photomask which is different from the first sub-photomask; second-patterning the first-patterned etch mask layer using the second photoresist pattern as an etch mask; removing the second photoresist pattern, and etching the material layer using the second-patterned etch mask layer.

In accordance with still another aspect of the present invention, when the shapes of the patterns of the first sub-photomask are different from that of the second sub-photomask, the photo process using the first sub-photomask is performed under different conditions than that of the photo process using the second sub-photomask, thereby easily optimizing the profiles of all patterns finally formed in the material layer. When all patterns finally formed in the material layer have the same size, the profiles of all patterns formed in the material layer can be optimized by manufacturing first and second sub-photomasks such that a minimum distance of patterns transcribed on the first sub-photomask and a minimum distance of patterns transcribed on the second sub-photomask are wider than the distances of the plurality of patterns. This is because whenever photo processes are performed using each of the sub-photomasks, the minimum distance of the patterns transcribed on the semiconductor substrate is wider than that in the conventional art, so that the interference or diffraction effect of the light beams generated between adjacent patterns is remarkably reduced. Particularly, when an etch mask layer is additionally formed on the material layer, profiles of each of the patterns can be further optimized.

According to the present invention, a plurality of patterns which are formed by using single photo process, are formed by using at least two photo processes, thereby optimizing the profiles of each of the patterns.

BRIEF DESCRIPTION OF THE DRAWINGS

The above features and advantages of the present invention will become more apparent upon reference to the following detailed description of specific embodiments and the attached drawings, of which.

DESCRIPTION OF THE PREFERRED EMBODIMENTS

Korean application Ser. No. 99-19985 filed Jun. 1, 1999 is hereby incorporated by reference as if fully set forth herein.

Hereinafter, preferred embodiments of the present invention will be described. The preferred embodiments of the present invention are described with respect to a photomask composed of two sub-photomasks (i.e., first and second sub-photomasks) for patterning one material layer. However, it will become readily apparent that the photomask may be composed of three or more sub-photomasks by further dissecting the patterns and repeating the steps used for the exemplary first and second sub-photomask.

Figure 1:
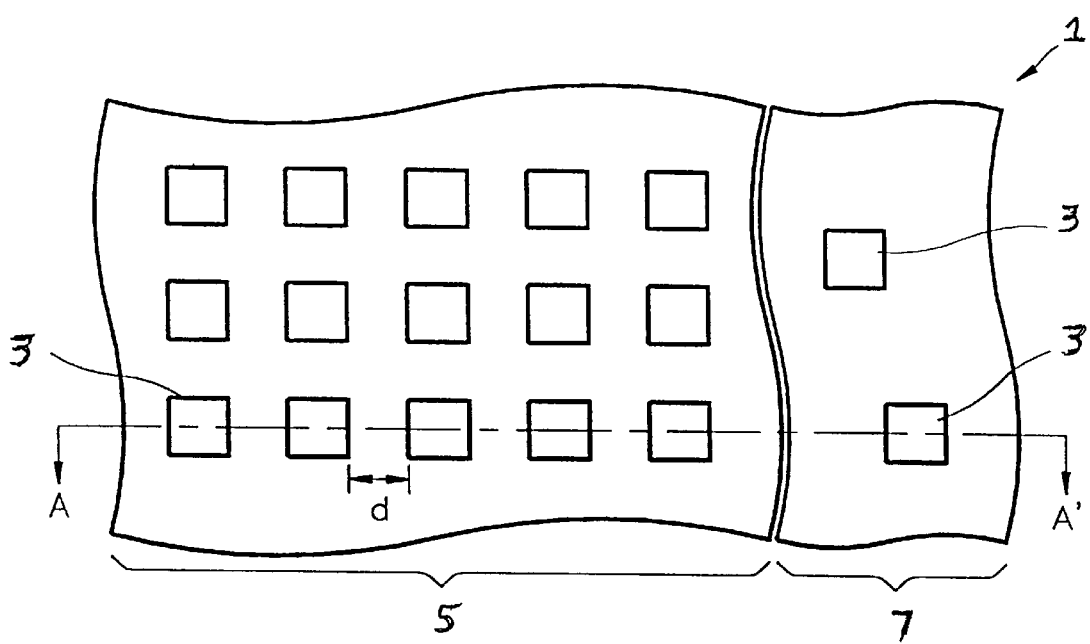
FIG. 1 is a plan view of a conventional photomask.
Figures 2A, 2B, 2C:
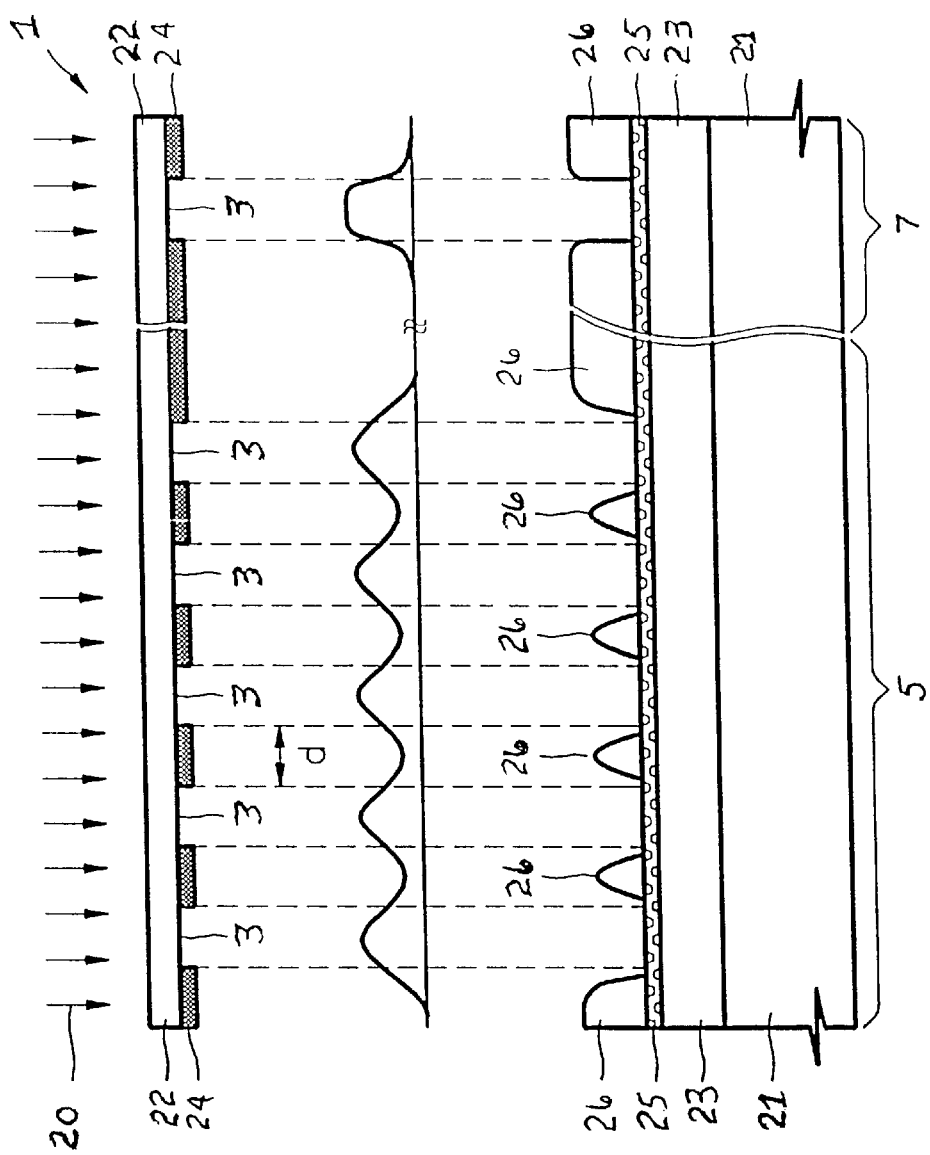
FIG. 2A is a cross-sectional view of the photomask of FIG. 1 taken along line A–A'.
FIG. 2B is a graph of intensity of light beams passing through contact hole patterns of the photomask shown in FIG. 2A.
FIG. 2C is a cross-sectional view of a profile of the photoresist pattern formed using the photomask of FIG. 2A.
Figure 3:
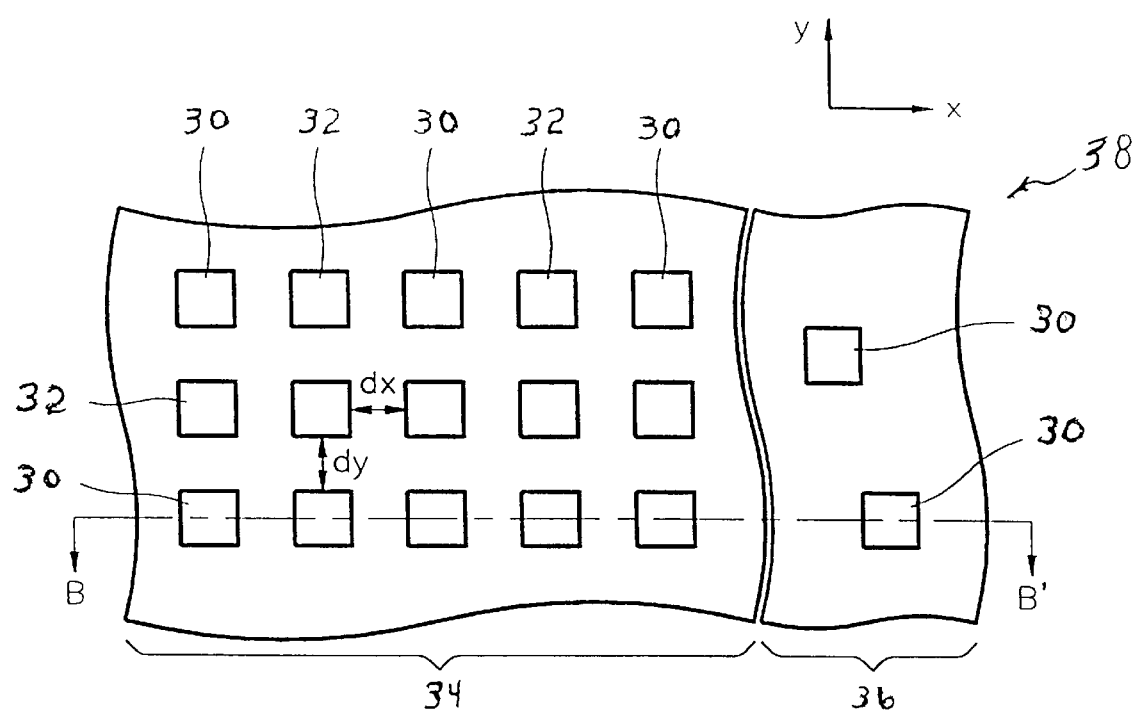
FIG. 3 is a layout view showing contact hole patterns of a photomask according to an embodiment of the present invention.

FIG. 3 is a layout view of patterns (e.g., contact hole patterns) to be finally formed according to the present invention. Here, reference numeral 34 denotes a high pattern density region (e.g., a cell array region) and reference character 36 denotes a low pattern density region (e.g., a peripheral circuit region). Also, the sizes of the patterns shown in FIG. 3 are identical.

Referring to FIG. 3, patterns (e.g., contact hole patterns) in photomask 38 are separated into a first group of patterns 30 and a second group of patterns 32 which are two-dimensionally arranged in the high pattern density region 34 and low pattern density region 36 respectively. Adjacent patterns in the high pattern density region 34 are separated by distances $d_x$ and $d_y$ along the x and y-directions respectively. The distances between adjacent patterns may be different.

Meanwhile, adjacent patterns in the low pattern density region 36 are separated by a larger distance than adjacent patterns in the high pattern density region 34. As previously mentioned, the patterns are classified into two groups of patterns, i.e., the first group of patterns 30 and the second group of patterns 32. The first group of patterns 30 include some of the patterns arranged in the high pattern density region 34 and all of the patterns arranged in the low pattern density region 36. The patterns arranged in the low pattern density region 36 may also be the second group of patterns 32. This is because the distance between the patterns arranged in the low pattern density region 36 is larger than those between the patterns arranged in the high pattern density region 34.

Adjacent first group patterns 30 must be separated by a distance longer than the distances $d_x$ and $d_y$ as shown in FIG. 3. Similarly, adjacent second group patterns 32 must be separated by a distance longer than the distances $d_x$ and $d_y$.

Figure 4A:
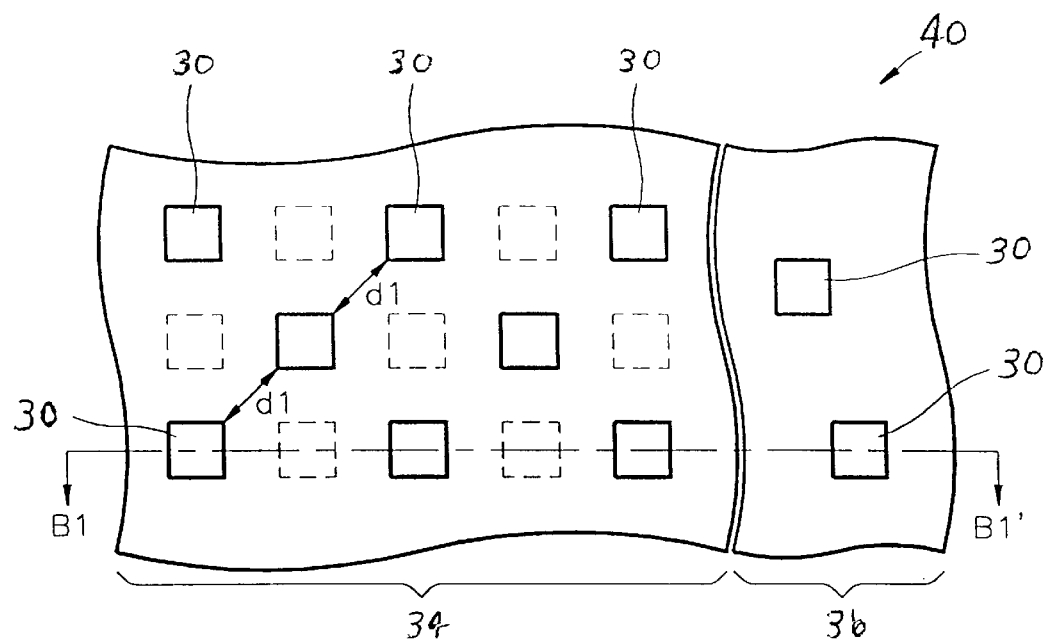
FIGS. 4A and 4B are plan views of two sub-photomasks manufactured according the layout shown in FIG. 3.
Figure 4B:
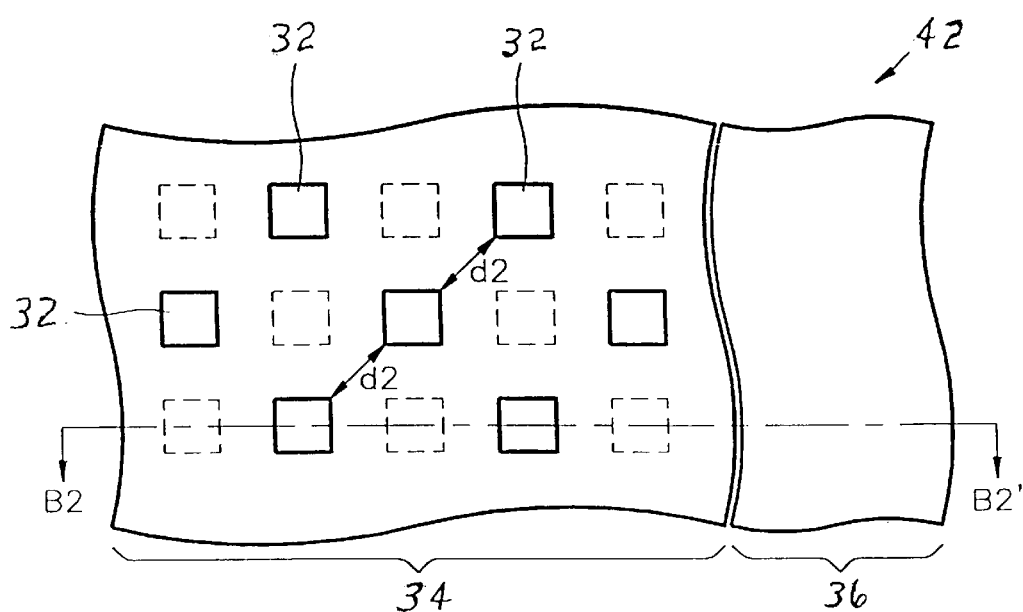

FIG. 4A is a plan view partially showing a first sub-photomask 40 in which only the first group of patterns 30 shown in FIG. 3 are transcribed on one side of a substrate, and FIG. 4B is a plan view partially showing a second sub-photomask 42 in which all patterns except the first group of patterns 30 shown in FIG. 3 (i.e., second group of patterns 32) are transcribed on one side of the transparent substrate.

As shown in FIGS. 4A and 4B, one of two adjacent patterns along the x and y-directions is the first group of patterns 30, and another thereof is the second group of patterns 32. Thus, the minimum distance d1 between adjacent first group patterns 30 transcribed on the first sub-photomask 40 is longer than either of the distances $d_x$ or $d_y$, and the minimum distance d2 between the second group patterns 32 transcribed on the second sub-photomask 42 is longer than either of the distances $d_x$ or $d_y$. Thus, during a photo lithographic process using the first sub-photomask 40 or the second sub-photomask 42, the interference or diffraction of light beams passing through the first and second group of patterns 30 or 32 respectively is remarkably suppressed.

Meanwhile, an alignment key (not shown in FIGS. 4A and 4B) may be included in at least one of the first and second sub-photomasks 40 and 42 respectively. When only one alignment key exists on only one in a sub-photomask, the alignment key is patterned through one lithographic photo process. Therefore, the photo process using one sub-photomask is performed under optimum conditions for forming the other fine patterns of the sub-photomask such as contact holes, so it may be difficult to obtain an alignment key having a desired profile. Thus, a pattern such as the alignment key may be included in at least two sub-photomasks.

FIGS. 5 through 8 are cross-sectional views illustrating a method for forming a fine pattern (e.g., a fine contact hole) using the first and second sub-photomasks 40 and 42 respectively as shown in FIGS. 4A and 4B. Here, FIGS. 5 through 8 are cross-sectional views taken along line B–B' shown in FIG. 3. Meanwhile, B1–B1' shown in FIG. 4A and B2–B2' of FIG. 4B correspond to B–B' shown in FIG. 3.

Figure 5:
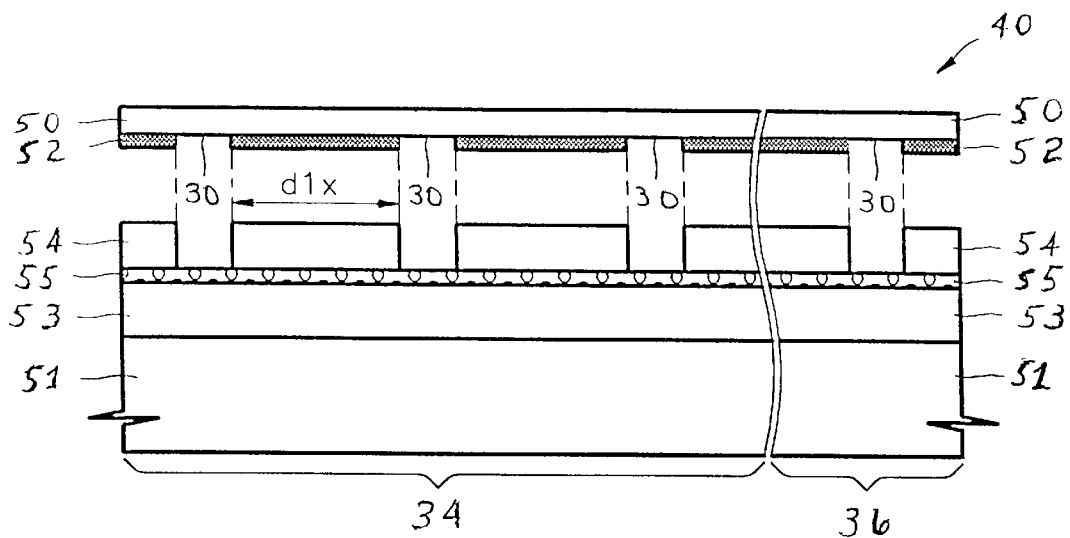
FIGS. 5 through 8 are cross-sectional views each illustrating a step in a method of forming a fine pattern using the two sub-photomasks shown in FIGS. 4A and 4B.

Referring to FIG. 5, a material layer 53 to be patterned (e.g., a dielectric layer such as a silicon oxide layer) is formed on a semiconductor substrate 51. Subsequently, an etch mask layer 55, which is an antireflection layer having an etch selectivity with respect to the material layer 53 is formed on the material layer. The etch mask layer 55 is formed of a silicon nitride layer or a silicon oxynitride layer. The formation of the etch mask layer 55 may be omitted. The first photoresist layer is formed on the etch mask layer 55, and the first photoresist layer is patterned by a photo lithographic process using the first sub-photomask 40 as shown in FIG. 4A, thereby forming a first photoresist pattern 54. The first sub-photomask 40 as shown in FIG. 5 includes a first transparent substrate 50 and the first opaque material pattern 52 formed on one side of the first transparent substrate 50. The first opaque material pattern 52 is a chrome pattern defining the first group of patterns 30 shown in FIG. 4A. Thus, the distance d between adjacent first group patterns 30 is longer than the minimum distance $d_x$ or $d_y$ between adjacent patterns shown in FIG. 3 so that interference or diffraction of light beams during exposure using the first sub-photomask 40 can be remarkably suppressed. As a result, abnormal formation of the profile of the first photoresist pattern 54 can be prevented. The minimum distance d1 between adjacent patterns in the first group of patterns 30 is not shown in FIG. 5. However, the minimum distance d1 is longer than the minimum distance $d_x$ or $d_y$ between adjacent patterns of FIG. 3. Thus, the first photoresist pattern 54 formed by the photo process using the first sub-photomask 40 has an improved profile compared to the conventional art.

Figure 6:
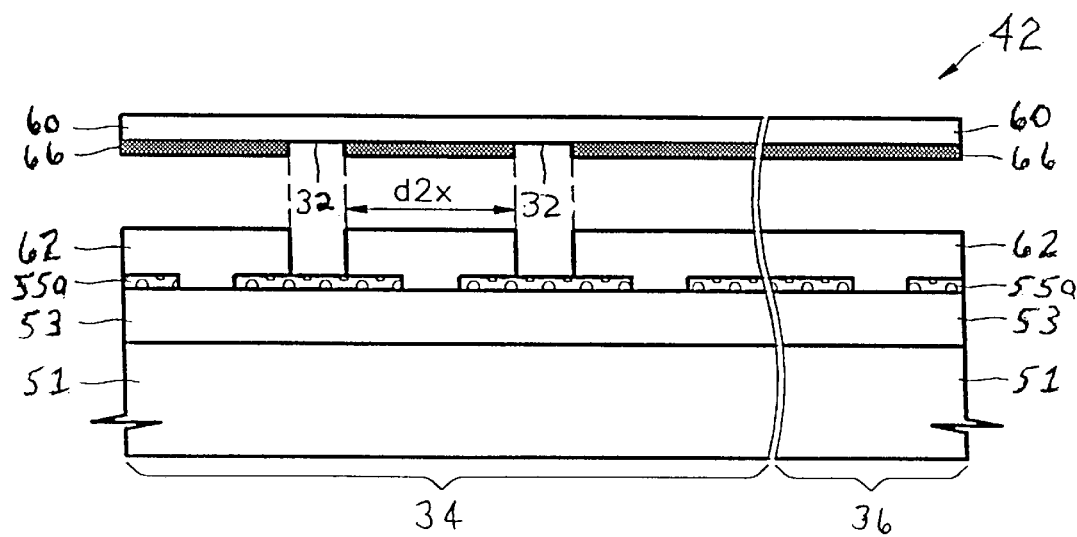

Referring to FIG. 6, the etch mask layer 55 is etched using the first photoresist pattern 54 as an etch mask layer thereby forming a first-patterned etch mask layer 55a. At this time, if there is no etch mask layer 55 on the material layer 53, the material layer 53 may be directly first-patterned using the first photoresist pattern 54 as an etch mask layer. Then, the first photoresist pattern 54 is removed, and a second photoresist layer 62 is formed. The second photoresist layer 62 is patterned by a photo lithographic process using the second sub-photomask 42 shown in FIG. 4B thereby forming the photoresist pattern 62. The second sub-photomask 42 includes a second transparent substrate 60 and a second opaque material pattern 66 formed on one side of the second transparent substrate 60. The second opaque material pattern 66 is a chrome pattern defining the second group patterns 32 shown in FIG. 4B. Thus, the distance $d2_x$ between adjacent second group patterns 32 is longer than the minimum distance $d_x$ or $d_y$ between the plurality of patterns shown in FIG. 3. As a result, the second photoresist pattern 62, like the first photoresist pattern 54, has an excellent profile compared to the conventional art.

Figure 7:
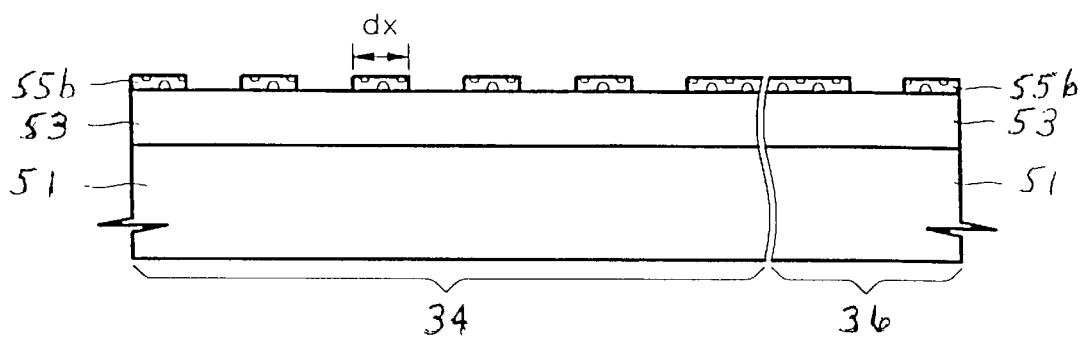

Referring to FIG. 7, the first-patterned etch mask layer 55a is etched using the second photoresist pattern 62 as an etching mask thereby forming a second-patterned etch mask layer 55b. At this time, if there is no etch mask pattern 55 on the material layer 53, the first-patterned material layer formed in the previous step may be directly etched using the second photoresist pattern 62 as an etch mask layer, to thereby form a second-patterned material layer. Then, the second photoresist pattern 62 is removed. The second-patterned etch mask layer 55b defines patterns composed of the first group of patterns 30 and second group of patterns 32. Thus, a distance between adjacent holes passing through the second-patterned etch mask layer 55b is the same as the first distance $d_x$ shown in FIG. 3. Also, the sizes of the holes formed in the second-patterned etch mask layer 55b are optimized due to the first and the second photoresist patterns 54 and 62, respectively.

Figure 8:
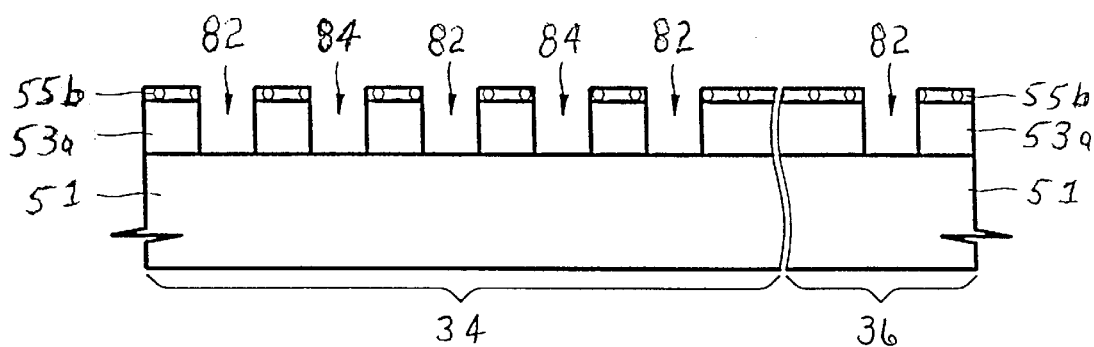

Referring to FIG. 8, the material layer 53 is etched using the second-patterned etch mask layer 55b, thereby forming a material layer pattern 53a including first and second holes 82 and 84 (e.g., contact holes). As a result, the profiles and sizes of each of the holes can be precisely controlled by two sub-photomasks for increasing the distance between patterns which are transcribed during each photo lithographic process.

Figure 9:
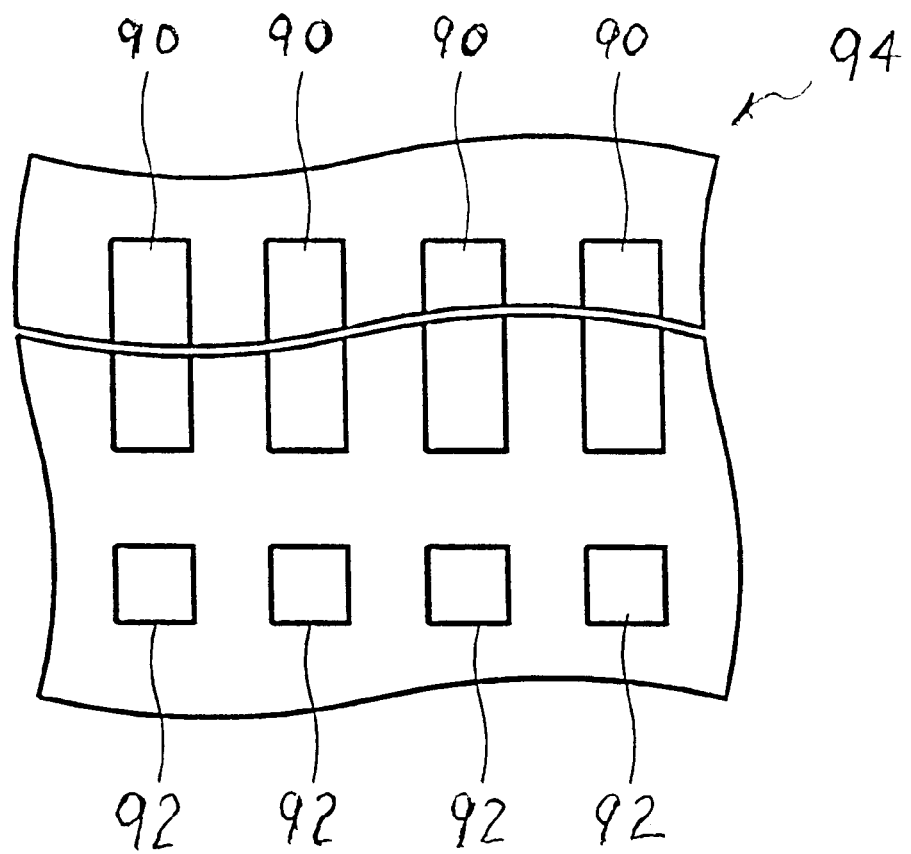
FIG. 9 is a layout view of a contact pattern according to another embodiment of the present invention.
Figure 10A:
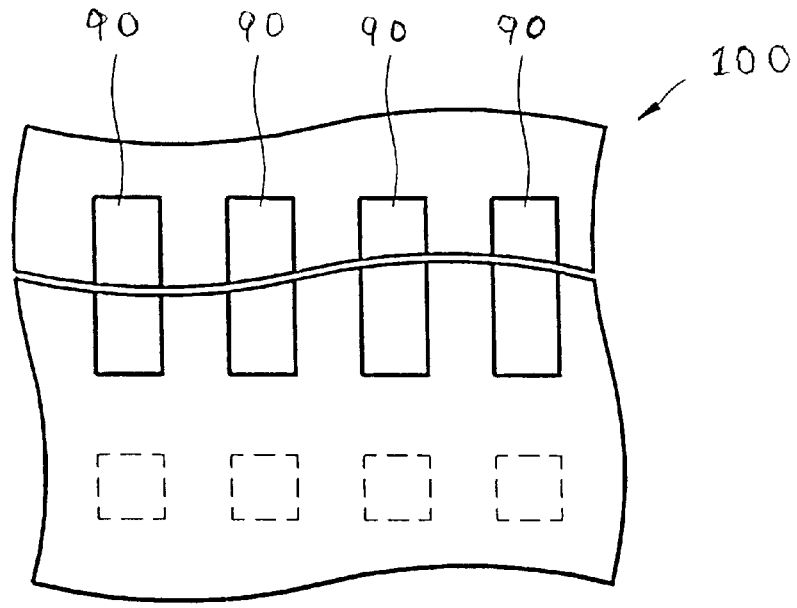
FIGS. 10A through 10B are plan views of two sub-photomasks manufactured according to the layout shown in FIG. 9.
Figure 10B:
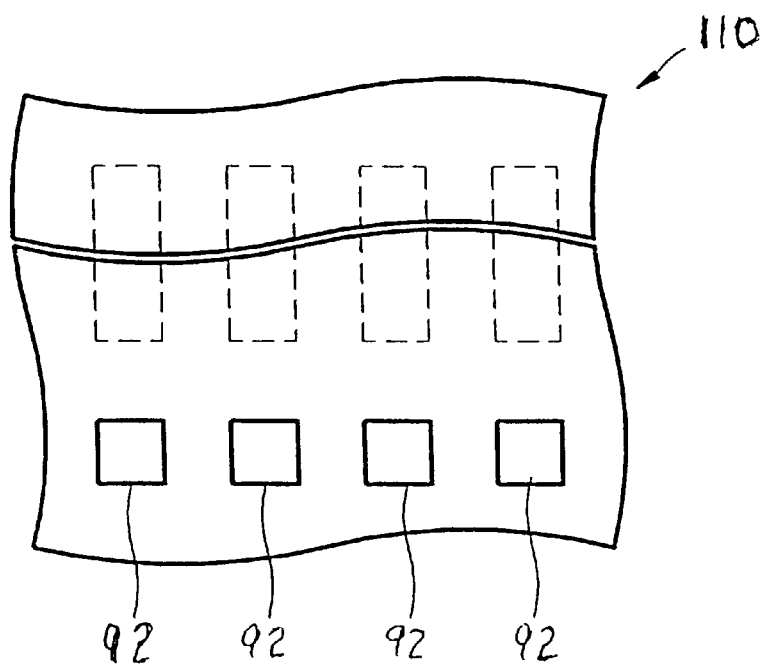

FIG. 9 is a partial layout illustrating a photomask 94 according to another embodiment of the present invention, and FIGS. 10A and 10B show a first and second sub-photomasks respectively based on the layout shown in FIG. 9. Here, a plurality of patterns to be formed on a semiconductor substrate have two shapes, which is different from the first embodiment shown in FIGS. 3, 4A and 4B. That is, a pattern of the first group is a rectangular pattern, and that of the second group is a regular square pattern. Here, the rectangular pattern corresponds to a bar pattern for forming an oval contact hole or a long interconnect, and the regular square pattern corresponds to a pattern for forming a circular contact hole.

Referring to FIG. 9, the patterns of a photomask 94 include a first group patterns 90 and a second group patterns 92. The first group patterns 90 are rectangular-shaped, and the second group patterns 92 are regular square-shaped.

Referring to FIGS. 10A and 10B, the first sub-photomask 100 includes the first group of patterns 90 shown in FIG. 9, i.e., rectangular patterns. In other words, the plurality of patterns of FIG. 9 are classified into two groups according to the shapes of the plurality of patterns regardless of the distance between the plurality of patterns.

Also, the second sub-photomask 110 includes the second group of patterns 92 shown in FIG. 9, i.e., regular square patterns.

The method of forming patterns on a semiconductor substrate using the first and the second sub-photomasks 100 and 110 respectively is the same as that described with respect to FIGS. 5 through 8. According to another embodiment of the present invention, rectangular patterns 90 and regular square patterns 92 are independently transcribed on the semiconductor substrate, using the first and the second sub-photomasks 100 and 110 respectively, so that profiles of all patterns can be optimized. In other words, conditions of the photo process using the first sub-photomask 100 are controlled such that they are different from those of the second sub-photomask 110, thereby optimizing the profiles of the rectangular patterns and regular square patterns.

According to the present invention, one material layer is patterned using at least is two sub-photomasks having different patterns, to thereby realize patterns having an optimized profile.

It should be understood that the invention is not limited to the illustrated embodiment and many changes and modifications can be made within the scope of the invention by a person skilled in the art.

Thus, a method of forming fine patterns of a semiconductor device has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method for forming fine patterns of a semiconductor device, comprising the steps of:

(a) forming a material layer to be patterned on a semiconductor substrate;

(b) forming an etch mask layer on the material layer;

(c) independently patterning the etch mask layer at least twice by using at least two sub-photomasks, which includes:

(c1) forming a first photoresist pattern on the etch mask layer using a first sub-photomask;

(c2) first-patterning the etch mask layer using the first photoresist pattern as an etch mask;

(c3) removing the first photoresist pattern;

(c4) forming a second photoresist pattern on the etch mask layer from which the first photoresist pattern was removed, using the second sub-photomask;

(c5) second-patterning the first-patterned etch mask layer using the second photoresist pattern as an etch mask; and (c6) removing the second photoresist pattern, wherein the first sub-photomask has patterns of a first group and the second sub-photomask has patterns of a second group, wherein the shape of the patterns of the first group is different from the shape of the patterns of the second group; and (d) patterning the material layer using the etch mask layer from step (c) thereby forming a material layer pattern having a plurality of patterns on the semiconductor substrate.

2. The method of claim 1, wherein the minimum distance between patterns of the first group and the minimum distance between patterns of the second group are longer than the minimum distance between two adjacent patterns of the plurality of the patterns formed in the material layer.

3. The method of claim 1, wherein the etch mask layer has an etch selectivity with respect to the material layer.

4. The method of claim 1, wherein the material layer is a dielectric layer or a conductive layer.

5. The method of claim 1, wherein the etch mask layer is a silicon nitride layer or a silicon oxynitride layer.

6. The method of claim 1, wherein the shape of the patterns of the first group are squares and the shape of the patterns of the second group are rectangles, or the shape of the patterns of the first group are rectangles and the shapes of the patterns of the second group are squares.

* * * * *

UNITED STATES PATENT AND TRADEMARK OFFICE
CERTIFICATE OF CORRECTION

PATENT NO. : 6,498,105 B1  Page 1 of 1
APPLICATION NO. : 09/583551
DATED : December 24, 2002
INVENTOR(S) : Ki-joon Kim It is certified that error appears in the above-identified patent and that said Letters Patent is hereby corrected as shown below:

Title Page:

Item (75): Inventor's name should read:

Ki-joon Kim

Signed and Sealed this

Twenty-second Day of August, 2006

JON W. DUDAS
*Director of the United States Patent and Trademark Office*